April 8, 1969 J. C. LEARY 3,437,941
WIDE BAND FREQUENCY DISCRIMINATOR
Filed April 7, 1966
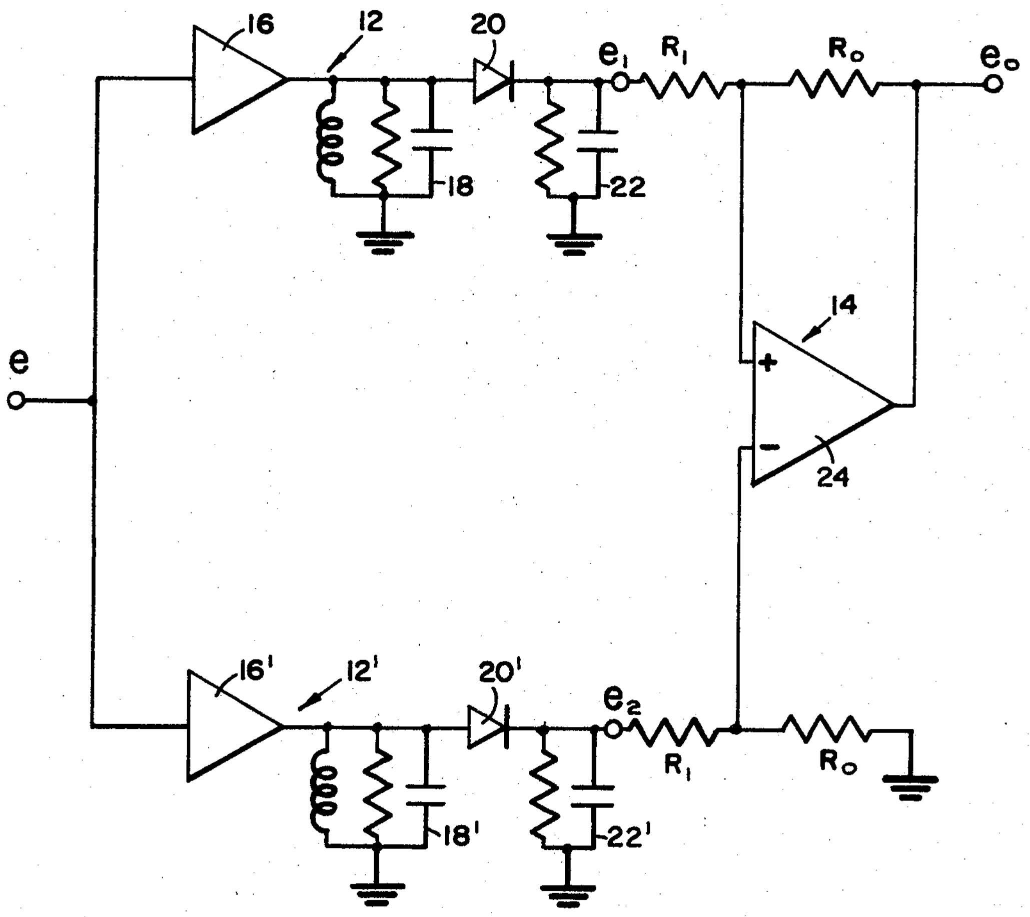
INVENTOR
JAMES C. LEARY
BY
ATTORNEY United States Patent Office 3,437,941
Patented Apr. 8, 1969

3,437,941

WIDE BAND FREQUENCY DISCRIMINATOR

James C. Leary, Baltimore, Md., assignor, by mesne assignments, to the United States of America as represented by the Secretary of the Navy Filed Apr. 7, 1966, Ser. No. 541,033
Int. Cl. H03d *1/18, 3/18, 3/26*
U.S. Cl. 329—142 3 Claims

ABSTRACT OF THE DISCLOSURE

A wide band frequency discriminator for sensing frequency excursions above and below a normal frequency. The discriminator has two parallel circuits, one tuned above the normal frequency and the second tuned below the normal frequency. Each parallel circuit consists serially of a buffer amplifier, a tuning network, a detector and a filter, and the outputs from the two circuits are combined via load and feedback resistors in a differential amplifier. The sensitivity of the circuit is adjusted by selection of the load and feedback resistors, and the bandwidth of the circuit may be varied independently of the sensitivity by proper choice of the parameters of the tuning networks. The circuit is devoid of transformers, and therefore may be readily microminiaturized.

Frequency discriminator circuits have long been used to detect the frequency of radio frequency signals. However, in general, such prior art circuits have permitted the achievement of only the desired bandwidth at the sacrifice of the sensitivity or the desired sensitivity at the sacrifice of the bandwidth. Additionally, the prior art circuits are quite complex in their requirements of electronic tubes, transformers and associated equipment.

Prior art discriminators such as the Foster-Seeley discriminator and the Travis discriminator, have generally used coupling transformers to connect the input signal with detectors located in parallel resonant circuits and then combining the outputs from the detectors to provide the discriminator output voltage signal. These prior art discriminators generally operate over a limited, narrow frequency bandwidth which is imposed by the operating characteristics of the input coupling transformer.

It is possible to increase the range of frequencies over which such prior art discriminators operate as, for example, by connecting a load to the secondary winding to lower the transformer circuit Q. However, connecting such a load causes the output voltage per cycle to decrease. This sacrifice of sensitivity to increase bandwidth is undesirable for many applications. Other undesirable effects, such as variations in mutual inductance in the Foster-Seeley circuit, are obtained when an attempt is made to operate prior art discriminators over a large frequency bandwidth.

In accordance with this invention there is provided a microminiaturized frequency discriminator circuit having flexibility of use, for example, in monitoring the frequency of radio signals, signals of FM receivers and AFC systems. The frequency discriminator circuit is made up of two similar parallel circuits each having means permitting the center frequencies and Q's of the circuits to be adjusted independently of each other and a detector and an operational amplifier which receives the outputs from the parallel circuits and functions as a differential amplifier to provide a single amplified output which is the resultant of the outputs of the parallel resonant circuits.

Accordingly, an object of the invention is to provide a frequency discriminator circuit in which either the bandwidth or the output voltage per cycle of input signal can be increased over that obtainable with prior art discriminators employing coupling transformers.

A further object of the invention is to provide a frequency discriminator which permits the achievement simultaneously of both the desired bandwidth and sensitivity in communication equipment.

For a better understanding of the invention reference should be made to the following description of the single figure of the drawing which is a schematic diagram of the circuitry of the invention.

Referring to the drawings, a source of alternating current which is to be discriminated as to departures from a constant value is indicated at $e$. The discriminator circuit shown is made up of two similar parallel resonant circuits 12 and 12' and a differential amplifier circuit 14. The parallel circuit 12 is formed of a buffer amplifier 16, a tuning network 18, a diode 20 and an RC filter network 22. The circuit 12' is similarly made up of buffer amplifier 16', a tuning network 18', a diode 20' and an RC filter network 22'. The output voltages from the respective networks 12 and 12' are indicated at $e_1$ and $e_2$ and these are supplied to an operating amplifier 24 of the amplifier circuit 14, as shown, to provide the single output voltage $e_0$. The operating amplifier 24 is modified by the provision of input load resistors $R_1$ and $R_1$ and feedback resistors $R_0$ and $R_0$ as shown to form the differential amplifier.

The RF signal at $e$ is applied to the two separate buffer amplifiers, and the output from amplifier 16, for example, is tuned above the center frequency by means of the tuning network 18 while the ouput from amplifier 16' is tuned below the center frequency by means of tuning network 18' and the outputs are rectified by diodes 20 and 20' to produce the respective D.C. voltage outputs $e_1$ and $e_2$. The buffer amplifiers 16 and 16' are utilized in order to isolate the RF signal from the other elements of the circuits and to permit the center frequencies and Q's of the two parallel resonant circuits to be adjusted independently of each other. The polarities of the diodes 20 and 20' are the same in order that both responses will be positive while the tuning circuits 22 and 22' are provided to remove objectionable demodulation products. By the provision of the load resistors $R_1$, $R_2$, and feedback resistors $R_0$ and $R_0$ as shown in the figure, the operational amplifier 24 will function as a differential amplifier having a balanced input and a single ended output. The transfer function of the differential circuit 14 will be $$e_0=(e_2-e_1)\frac{R_0}{R_1}$$

The differential circuit 14 is consequently capable of performing the function of subtraction and a predetermined gain dependent upon the ratio of $R_0/R_1$. Additionally the differential circuit 14 has other desirable characteristics such as high input impedance, isolation of input terminals, high common mode ratio, and excellent temperature characteristics and is very stable because of its high gain and the external negative feedback.

The above described invention provides a frequency discriminator whereby the bandwidth-linearity requirements may be satisfied by proper design of the parallel resonant circuits and the sensitivity requirements satisfied by proper selection or proportioning of the ratios of $R_0$ and $R_1$. The discriminator circuit of the invention may be formed as a microminiaturized unit by available commercial elements as, for example, by using Westinghouse thin film circuits identified as TA–I for each of the parallel resonant circuits 12 and 12' and combining these with the Fairchild operational amplifier identified as UA–702C on a thin film wafer to provide a packaged circuit of approximately 0.3 inch by 0.5 inch by 0.5 inch.

It should be understood, of course, that the foregoing disclosure relates to only a preferred embodiment of the invention and that numerous modifications or alterations may be made therein without departing from the spirit and the scope of the invention.

I claim:

1. A frequency discriminator circuit responsive to input signal frequency variations about a center frequency comprising:

(a) a first circuit coupled in series with an input signal;

(b) a second circuit coupled in series with the input signal and parallel with said first circuit;

(c) a buffer amplifier at the input of each of said first and second circuits to isolate each circuit from other elements of said frequency discriminator circuit;

(d) a tuning network in each of said first and second circuits connected to the output of each buffer amplifier, the tuning network in said first circuit being tuned above the center frequency and the tuning network in said second circuit being tuned below the center frequency;

(e) a detector in each of said first and second circuits connected to the output of each tuning network, the voltage out of said first detector in said first circuit being $e_1$ and the voltage out of said second detector in said second circuit being $e_2$;

(f) a load resistor $R_1$ and a feedback resistor $R_0$ in series in each of said first and second circuits to receive voltages $e_1$ and $e_2$;

(g) a differential amplifier having input terminals connected between the juncture of resistors $R_1$ and $R_0$ in each of said first and second circuits, the output of the differential amplifier connected between the juncture of an output terminal and the feedback resistor $R_0$ of the first circuit and yielding an output voltage $e_0$, the transfer function of said differential amplifier being $$e_0=(e_2-e_1)\frac{R_0}{R_1}$$

(h) whereby, the bandwidth-linearity function of said frequency discriminator circuit may be adjusted by proper selection of the parameters of said first and second tuning networks, and the sensitivity of said frequency discriminator circuit may be adjusted by proper selection of said load resistors and said feedback resistors.

2. A circuit as set forth in claim 1 wherein:

(a) each parallel circuit has filter means connected to to the output of each detector to remove objectionable demodulation products.

3. A circuit as set forth in claim 1 wherein:

(a) each of the parallel circuits is comprised of a miniature thin film circuit;

(b) the differential amplifier is also a miniature thin film circuit;

(c) whereby, the packaged frequency discriminator circuit is microminiaturized, and has dimensions in the order of .3 inch by .5 inch by .5 inch.

References Cited

UNITED STATES PATENTS

| | | | |
|---|---|---|---|
| 2,457,207 | 12/1948 | Carlson | 329—142 X |
| 2,941,075 | 6/1960 | Christian | 329—142 X |
| 2,969,468 | 1/1961 | Hogue | 307—233 X |
| 2,984,791 | 5/1961 | Chasek | 329—141 |
| 3,183,449 | 5/1965 | Bray | 329—142 |

ALFRED L. BRODY, *Primary Examiner.*

U.S. Cl. X.R.

307—233; 325—349; 328—133; 329—50, 192